(12) United States Patent
Sasaki et al.

(10) Patent No.: US 7,365,346 B2
(45) Date of Patent: Apr. 29, 2008

(54) ION-IMPLANTING APPARATUS, ION-IMPLANTING METHOD, AND DEVICE MANUFACTURED THEREBY

(75) Inventors: Yuichiro Sasaki, Machida (JP); Bunji Mizuno, Ikoma (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/023,467

(22) Filed: Dec. 29, 2004

(65) Prior Publication Data

US 2006/0138353 A1 Jun. 29, 2006

(51) Int. Cl.
*H01J 37/317* (2006.01)
(52) U.S. Cl. .................... 250/492.21; 250/398
(58) Field of Classification Search ............ 250/423 R, 250/251, 427, 492.2, 492.3, 437
See application file for complete search history.

(56) References Cited

U.S. PATENT DOCUMENTS

| | | | | |
|---|---|---|---|---|
| 4,361,762 | A | * | 11/1982 | Douglas ..................... 250/251 |
| 4,419,584 | A | * | 12/1983 | Benveniste ............... 250/492.2 |
| 4,754,200 | A | * | 6/1988 | Plumb et al. ............ 315/111.81 |
| 5,089,707 | A | | 2/1992 | Magnuson |
| 5,132,544 | A | * | 7/1992 | Glavish ................... 250/492.2 |
| 5,262,652 | A | * | 11/1993 | Bright et al. ............ 250/492.2 |
| 5,420,415 | A | | 5/1995 | Trueira |
| 5,432,352 | A | * | 7/1995 | van Bavel ............. 250/492.21 |
| 5,834,786 | A | * | 11/1998 | White et al. ........... 250/492.21 |
| 6,756,600 | B2 | * | 6/2004 | Ng et al. ............... 250/492.21 |
| 2002/0053642 | A1 | * | 5/2002 | Berrian ........................ 250/427 |
| 2004/0058513 | A1 | * | 3/2004 | Murrell et al. ............... 438/535 |
| 2004/0191931 | A1 | * | 9/2004 | Murrell et al. .................. 438/7 |
| 2005/0126905 | A1 | * | 6/2005 | Golovchenko et al. ...................... 204/192.34 |
| 2005/0223991 | A1 | * | 10/2005 | Walther et al. ......... 118/723 R |

FOREIGN PATENT DOCUMENTS

| | | |
|---|---|---|
| JP | 01-098470 | 6/1989 |
| JP | 04-123754 | 4/1992 |
| JP | 04-315754 | 11/1992 |
| JP | 07-254386 | 10/1995 |
| JP | 08-055596 | 2/1996 |
| JP | 10-112277 | 4/1998 |
| JP | 2000-182526 | 6/2000 |
| JP | 2000-315473 | 11/2000 |

OTHER PUBLICATIONS

High-Sensitive Measurement of Beam Current in Storage Ring, Magazine of The Physical Society of Japan, Japan, Jan. 5, 1999, vol. 54 No. 1, 34-40, with English abstract.
Japanese Office Action dated Oct. 24,. 2007 issued in Japanese Application No. 2002-169536.

\* cited by examiner

*Primary Examiner*—Nikita Wells
*Assistant Examiner*—Johnnie L Smith, II
(74) *Attorney, Agent, or Firm*—Wenderoth, Lind & Ponack, L.L.P.

(57) ABSTRACT

An ion-implanting apparatus and method can dynamically control a beam current value with time and does not change energy. This ion-implanting apparatus controls a dynamic change in beam current value with time by giving feedback on the beam current value measured with a beam current measuring device.

22 Claims, 5 Drawing Sheets

ION-IMPLANTING APPARATUS, ION-IMPLANTING METHOD, AND DEVICE MANUFACTURED THEREBY

FIELD OF THE INVENTION

The present invention relates to an ion-implanting apparatus, an ion-implanting method, and devices manufactured by the apparatus and method. The present invention relates to control of a beam current value of an ion-implanting apparatus for radiating an ion beam onto an object to be processed, such as a semiconductor wafer, and implanting ions.

BACKGROUND OF THE INVENTION

In introduction of impurities using an ion-implanting apparatus, concentration and depth of implantation are easily controlled. For this reason, ion-implanting apparatuses are generally used in a step of introduction of impurities in production of semiconductor devices.

Figure 10:
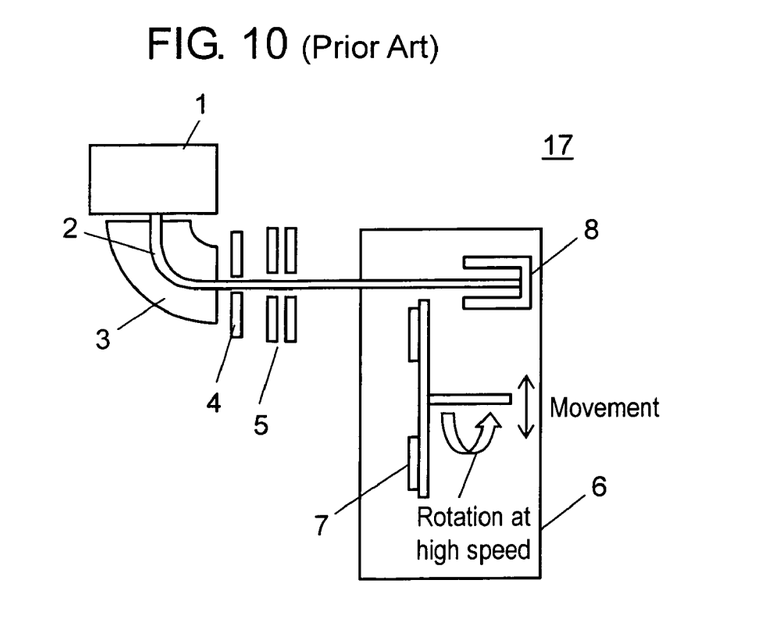
FIG. 10 is a sectional view of an essential part of a conventional ion-implanting apparatus.

FIG. 10 is a sectional view of an essential part showing an example of a conventional ion-implanting apparatus. This drawing illustrates a high-current ion-implanting apparatus. In conventional ion-implanting apparatus 17, ion beam 2 is obtained by making a predetermined gas into plasma in ion source 1 and extracting ions with predetermined energy in the plasma from an extracting electrode. Desired ions are isolated from extracted ion beam 2 by mass spectrometry using mass spectrograph 3. Further, ions are completely isolated using splitting slit 4. Thereafter, the desired ions are accelerated to have final energy through accelerating electrode 5, and radiated onto an object to be processed, such as semiconductor wafer 7, disposed in implantation room 6. A beam current value of radiated ion beam 2 is measured by Faraday cup 8 to provide a quantity of impurities introduced.

Figure 6:
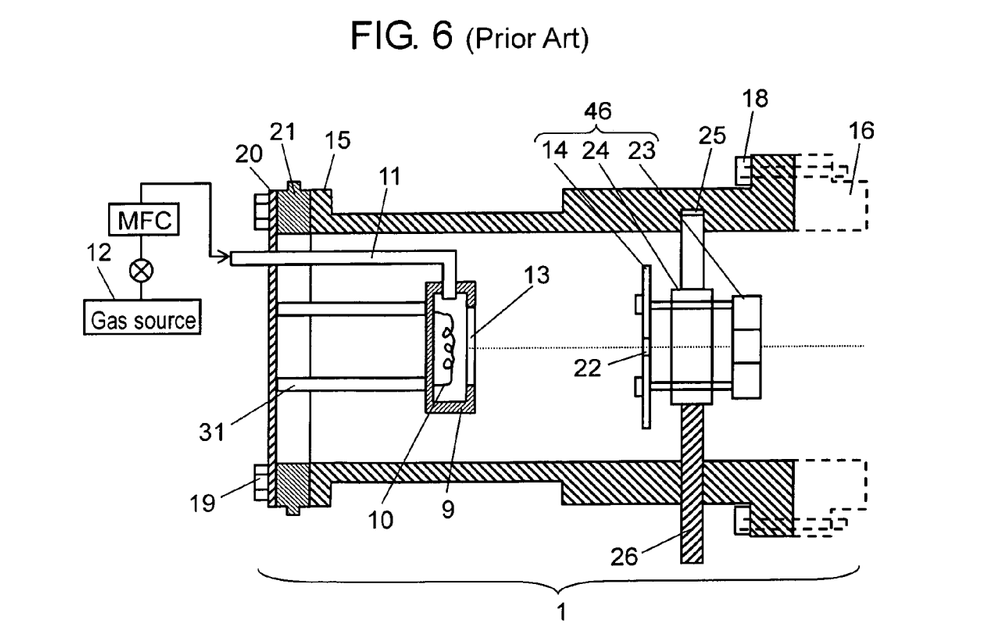
FIG. 6 is a sectional view of an essential part of a conventional ion source.

FIG. 6 is a sectional view of an essential part showing an example of a conventional ion source. This drawing illustrates a Freeman type ion source. Ion source chamber 15 is formed of stainless steel, for example, into a cylindrical shape. Ion chamber 15 is approximately 300 mm in length and approximately 180 mm in diameter, for example. A flange portion at one end of ion source chamber 15 is fastened onto a body of ion-implanting apparatus 16 via bolts 18. A flange portion at another end of ion source chamber 15 is fastened to lid 20 by screws 19 via insulator 21 and a sealing member (not shown). This structure hermetically seals an interior of ion source chamber 15. Incidentally, filament 10 is provided inside of arc chamber 9. Gas supply nozzle 11 in communication with an interior of arc chamber 9 connects to gas source 12 via a gas passage including a mass flow controller and a valve. This structure allows supply of a dopant gas, such as arsine ($AsH_3$), from gas supply nozzle 11 to the interior of arc chamber 9.

On a side of an ion extracting direction in arc chamber 9, ion outlet 13 is provided. In a position facing ion outlet 13, extracting electrode 14 is provided. Extracting electrode 14 has an ion through-hole 22. The ion through-hole is aligned with a center of the body of ion-implanting apparatus 16, in ion source chamber 15. Extracting electrode 14 is supported by ring-shaped base electrode 23 via electrically conductive struts. Base electrode 23 is supported by ground electrode 24 via insulating members, such as insulators. One end of ground electrode 24 is supported by a supporting post in intimate contact with a supporting hole provided in a sidewall of ion source chamber 15. Another end of ground electrode 24 is supported by supporting rod 26 that can project through the sidewall radially of ion source chamber 15. Extracting electrode 14 and base electrode 23 have the same electric potential, and are structured to be supported by ground electrode 24 via the insulating members.

During ion-implantation, a predetermined gas is introduced into arc chamber 9, and a predetermined high current is applied to filament 10 from a power source for generating thermal electrons. This current is a DC current of 150 A, for example. Further, a predetermined negative DC voltage of −100V, for example, is applied from a power source for generating arc discharge. Thus, discharge occurs between filament 10 and arc chamber 9, and a predetermined processing gas dissociates to generate plasma. At this time, a power source for extracting ions applies a predetermined high DC voltage of 80 kV, for example, across arc chamber 9 and extracting electrode 14. This extracts only positive ions in plasma generated in arc chamber 9 in a direction of extracting electrode 14 to form ion beam 2. A part where ion beam 2 passes is maintained at a vacuum of approximately $10^{-5}$ Torr, using a turbo-molecular pump or a cryopump.

Ion-implanting apparatuses supply ion beams 2 with high energy resolution. For this purpose, some ideas are considered to prevent fluctuations of voltage of extracting electrode 14 and an accelerating voltage of accelerating electrode 5, and keep these voltages constant. For example, in an ion-extracting power source for outputting a predetermined DC voltage to ion source 1 and extracting electrode 14, general commercial AC power is converted into desired DC power for use. AC components left after conversion, i.e. ripple components, cause variations in energy of ion beams 2. To address this problem, as shown in a technique of reducing ripple components in low energy injection disclosed in Japanese Patent Unexamined Publication H10-112277, maintaining high energy resolution is important.

As to ion source 1, a shape of ion outlet 13, a position of extracting electrode 14, gas flow and pressure supplied into arc chamber 9, current and voltage applied to filament 10, arc voltage, arc current, and magnetic field strength for trapping electrons inside of arc chamber 9 are optimized, according to a desired type of ions and extracting electrode. Additionally, according to implantation conditions, the shape of ion outlet 13 is changed or an extracting voltage is adjusted before ion beam 2 is set. Further, a device for changing a position of extracting electrode 14 to change a distance to ion outlet 13 is generally provided.

SUMMARY OF THE INVENTION

An ion-implanting apparatus controls variations in a beam current value by giving feedback on the beam current value, measured by a beam current measuring device, to at least one parameter selected from a group consisting of a shape of an ion outlet provided in an arc chamber of an ion source, a position of an extracting electrode, dopant gas flow, dopant gas pressure, current and voltage applied to a filament, arc voltage, arc current, magnetic field strength for trapping electrons inside of the arc chamber, and a position of the arc chamber.

Active devices and passive devices are manufactured by using the above ion-implanting apparatus.

An ion-implanting method controls variations in a beam current value by giving feedback on the beam current value, measured by a beam current measuring device, to at least one parameter selected from a group consisting of a shape of an ion outlet provided in an arc chamber of an ion source, a position of an extracting electrode, dopant gas flow, dopant gas pressure, current and voltage applied to a filament, arc voltage, arc current, magnetic field strength for trapping electrons inside of the arc chamber, and a position of the arc chamber.

DETAILED DESCRIPTION OF THE PREFERRED EMBODIMENTS

During ion implantation, it is desirable that fluctuations of a value of beam current radiated onto an object to be processed are small. However, with a conventional method, a beam current value actually fluctuates by approximately 5% and is not kept constant.

One of factors of the above problem is that a condition of ion source 1 in the conventional ion-implanting apparatus changes with time. In other words, filament 10 and a surface condition of an inner wall of arc chamber 9 change, thermal expansion changes a dimension of arc chamber 9, temperature change in gas piping from gas source 12 to gas supply nozzle 11 changes a volume of dopant gas, and ion density in a plasma changes with time. These changes change a condition of ion source 1 previously set according to a desired type of ions and extracting electrode, thus causing fluctuations of a beam current value. On the other hand, it is difficult to control a change in condition so that this condition is kept constant.

Incidentally, as described in the Background Art, for example, a device for changing a position of an extracting electrode in a vertical, horizontal, or rotational direction is generally used. However, this device is mainly used at setting of ion beam 2 before ion implantation. In other words, this device statically changes the position of the extracting electrode, and cannot control a dynamic change in beam current value with time.

Thus, there is a need of a technique of maintaining a beam current value constant irrelevant of a change in a condition of ion source 1 with time. However, energy to be injected must be kept within a certain range including a desired value. In other words, a measure of changing extracting voltage to inhibit fluctuations of a beam current value, which causes a change in energy, cannot be taken.

As described above, it is required to provide an ion-implanting apparatus that can dynamically control a beam current value of an ion beam with time and does not change energy.

The present invention provides an ion-implanting apparatus and an ion-implanting method capable of addressing the above problems, and devices manufactured by the apparatus and the method. The present invention is described with reference to FIGS. 1 through 9.

In an ion-implanting apparatus of the present invention, a beam current measuring device measures a beam current value of ion beam 2, and feedback on this measurement allows control of a dynamic change in the beam current value with time. The feedback on the measurement is given to at least one parameter selected from a group consisting of a shape of an ion outlet provided in an arc chamber of an ion source, a position of an extracting electrode, dopant gas flow, dopant gas pressure, current and voltage applied to a filament, arc voltage, arc current, magnetic field strength for trapping electrons inside of the arc chamber, and a position of the arc chamber. In other words, the present invention changes at least one of the above parameters to control a beam current value, according to a change in the condition of ion source 1, which has been difficult to control as described as problems of the conventional method.

How to vary a shape of ion outlet 13 is described. The shape of ion outlet 13 is made into a variable structure using a mechanism of a slit, shutter, valve, door, or nozzle. As a driving method, use of deformation of a piezoelectric element, gas pressure, liquid pressure, thermal deformation, or motor force allows control of minute dimensional change. As to a motor, use of a servo motor, linear motor, stepping motor, or ultrasonic motor allows precise driving. It is desirable that the mechanism for varying the shape of ion outlet 13 is attached to lid 20 together with arc chamber 9. It is also desirable that lid 20, arc chamber 9, and the mechanism for varying the shape of ion outlet 13 are made as a structure detachable by removing lid 20 from ion source chamber 15. This is because such a structure can maintain a labor hour taken for maintenance, such as cleaning of ion source 1, at the same level as a conventional standard.

Structure for measuring beam current includes Faraday cup 8, a beam current measuring device, and DC converter. The beam current measuring device at least includes: (a) a detecting section for detecting or collecting a magnetic field corresponding to beam current; (b) a measuring section including: (i) a superconducting quantum interference device (SQUID) sensitive to magnetic flux; and (ii) a feedback coil for carrying feedback current to cancel out a change in magnetic flux penetrating through the SQUID. It is desirable that the beam current measuring device also includes a magnetic flux transfer section for transferring the magnetic flux detected or collected by the detecting section to the measuring section, because its sensitivity can be adjusted. It is desirable that the beam current measuring device further includes a magnetic shielding section made of a superconductor for magnetically shielding the detecting section, the magnetic flux transfer section, and the measuring section from an external space including a space carrying ion beam 2, because external magnetic noises can be reduced. When Faraday cup 8 is used as a device for measuring the beam current, Faraday cup 8 is generally placed behind or on a side of a disk carrying an object to be processed for measurement. In this case, radiation of a beam onto the object to be processed and measurement of the beam current value cannot be performed at the same time.

Additionally, there is a problem of several percent of error included in measurement caused by outgas 28 emitted from semiconductor wafer 7. In contrast, when a beam current measuring device or a DC converter is used, the following advantage is provided. When such a device is placed on a side of ion source 1, i.e. on an upstream side, of an object to be processed, on a beam line, measurement of the beam current value and radiation of ion beam 2 onto the object to be processed can be performed at the same time. Further, because the beam current value can be measured before contact of outgas 28 and ion beam 2, this measurement does not have error caused by outgas 28. It is desirable to use a DC converter, when a beam current of a milliampere or higher is measured with an error of several microamperes. On the other hand, it is desirable to use a beam current measuring device when a beam current ranging from several dozens nanoamperes to several microamperes is measured with an error of several nanoamperes, or beam current ranging from several microamperes to several dozens of milliamperes is measured with an error of 0.1% or smaller.

The present invention can provide an ion-implanting method and ion-implanting apparatus that can dynamically control a beam current value of an ion beam with time and does not change energy.

The present invention is further detailed.

Mechanism for Varying Shape of Ion Outlet

Figure 1:
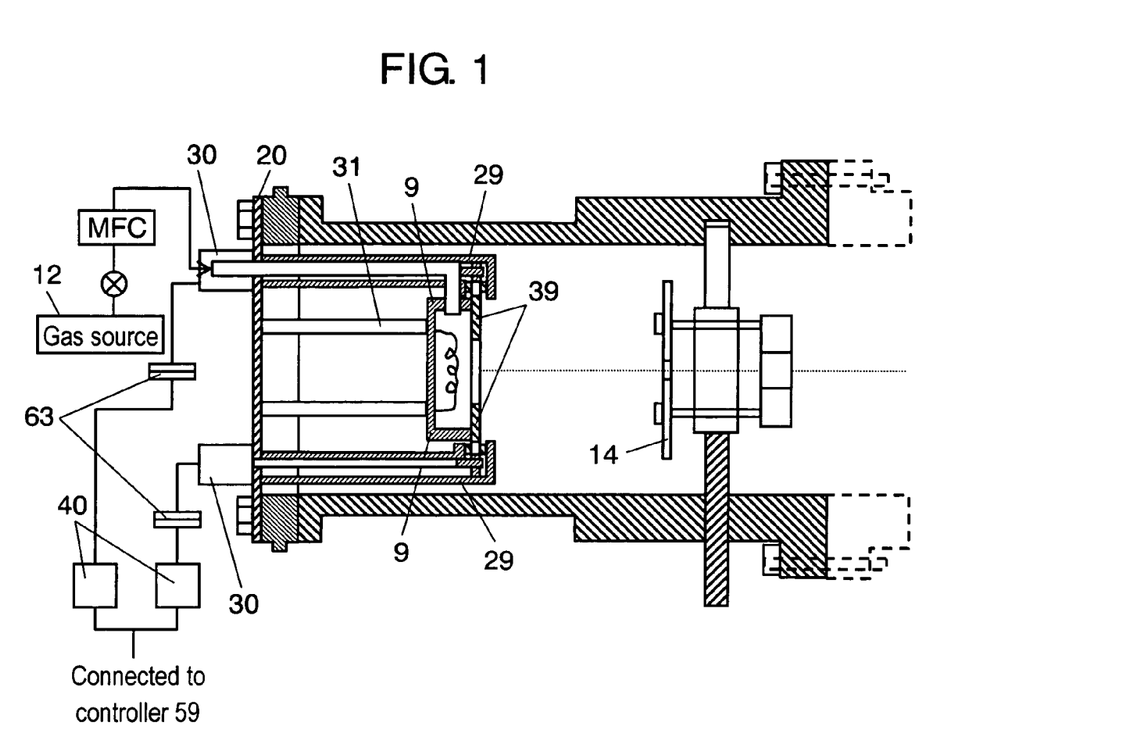
FIG. 1 is a sectional view of an essential part showing an example of a mechanism for varying a shape of an ion outlet in accordance with the present invention.

FIG. 1 is a sectional view of an essential part showing an example of movable partition plate mechanisms 29 of the present invention together with ion source chamber 15. A description is provided of movable partition plate mechanisms 29, a feature of the present invention. Onto lid 20, two small servo motors 30, two movable partition plate mechanisms 29, and a plurality of supports 31 are fixed. The plurality of supports 31 fix arc chamber 9.

Figure 2:
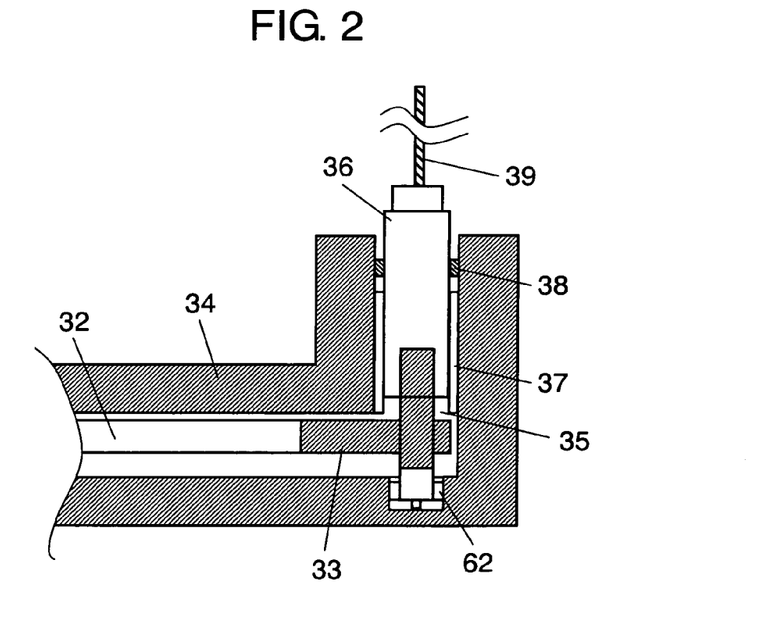
FIG. 2 is a sectional view of an essential part of a movable partition plate mechanism of FIG. 1

A further description is provided with reference to FIG. 2. A shaft of each of small servo motors 30 connects to rotating shaft 32. A portion near a tip of rotating shaft 32 forms ball screw A 33. Rotating shafts 32 and ball screws A 33 are housed in housings 34 of movable partition plate mechanisms 29. In each housing 34, rotation of ball screw A 33 is converted into rotation of ball screw B 35 by a rack and pinion, or the like. Movable rod 36 is fitted over each of ball screws B 35. Movable rod 36 has a groove of a feed screw. With this structure, rotation of each ball screw B 35 moves corresponding movable rod 36 in parallel with a central axis of ball screw B 35. Slide bearings 37 and seals 38 are provided between movable rods 36 and housings 34. These members allow movable rods 36 to smoothly translate and an inside of ion source chamber 15 to be maintained hermetically sealed. At ends of movable rods 36, partition plates 39 are connected.

With such a structure, partition plates 39 can translate in a direction perpendicular to a traveling direction of ion beam 2, by using rotation of ball screws A 33 caused by small servo motors 30 as force. In other words, the shape of ion outlet 13 can be changed by using a mechanism of a slit. Positioning accuracy and positioning time of partition plates 39 are determined by performance of small servo motors 30, drivers 40, and an actuator including the ball screws. The positioning accuracy can be set to approximately 10 to 100 μm. The positioning time can be set to approximately 50 to 100 ms.

A part of extracting electrode 14 has a structure that is employed in a conventional Freeman ion source.

Mechanism for Varying Position of Arc Chamber

Figure 3:
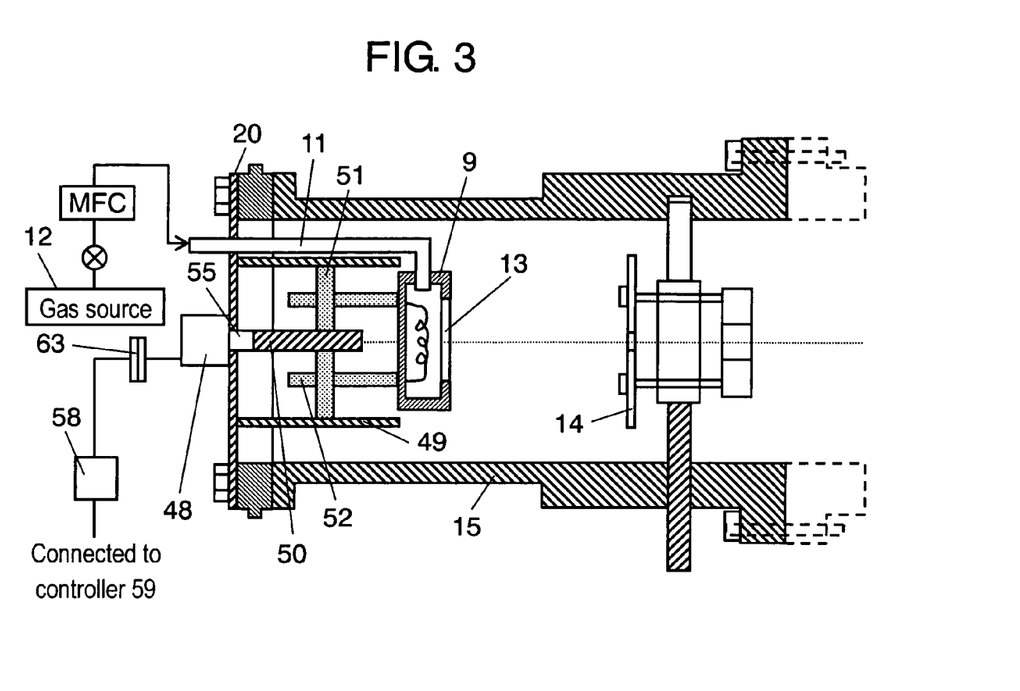
FIG. 3 is a sectional view of an essential part showing an example of a mechanism for varying a position of an arc chamber in accordance with the present invention.

FIG. 3 is a sectional view of an essential part showing movable arc chamber 9 of the present invention together with ion source chamber 15. A description is provided of movable arc chamber 9, which is a feature of the present invention. Onto lid 20, small servo motor 48 and guides 49 are fixed. A tip of shaft 55 of small servo motor 48 connects to ball screw E 50. According to rotation of shaft 55, ball screw E 50 rotates. This structure forms a mechanism in which rotation of ball screw E 50 moves supporting plate 51 parallel to a central axis of ball screw E 50. The central axis of ball screw E 50 is placed in parallel with a traveling direction of ion beam 2. Movement of supporting plate 51 is restricted by guides 49. Supporting plate 51 moves parallel to the central axis of ball screw E 50 while keeping its surface perpendicular to the central axis of ball screw E 50. A plurality of supports 52 is fixed to supporting plate 51. At ends of supports 52, arc chamber 9 is fixed. Thus, arc chamber 9 moves parallel to the traveling direction of ion beam 2, like supporting plate 51.

Figure 4:
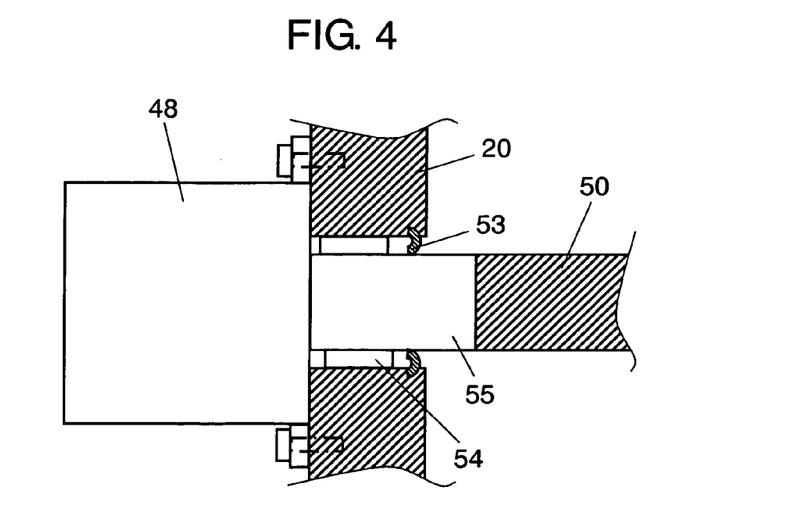
FIG. 4 is a sectional view of an essential part showing how to attach a small servo motor to a lid in FIG. 3.
Figure 5:
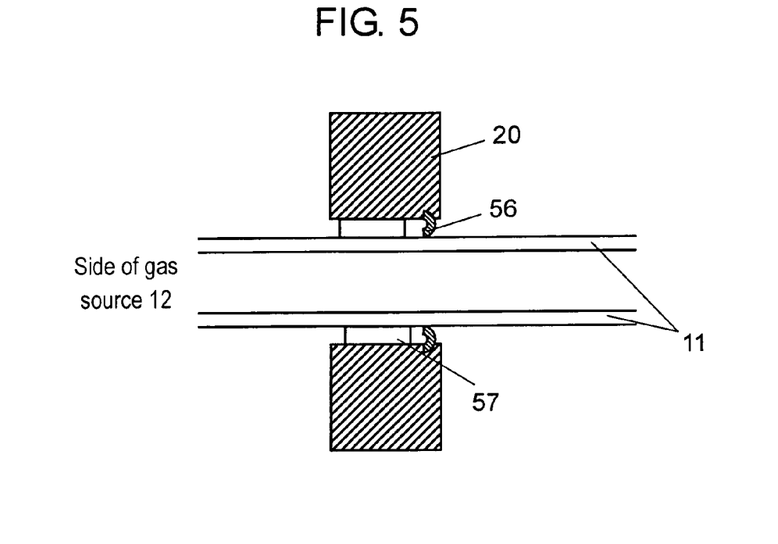
FIG. 5 is a sectional view of an essential part showing how to attach a gas supply nozzle to the lid in FIG. 3.

In a portion where lid 20 is in contact with shaft 55, as shown in FIG. 4, for example, seal 53 and rotating bearing 54 are provided so that shaft 55 of small servo motor 48 can precisely rotate while maintaining an interior of ion source chamber 15 hermetically sealed. Additionally, gas supply nozzle 11 connects to arc chamber 9. In a portion where lid 20 is in contact with gas supply nozzle 11, as shown in FIG. 5, for example, seal 56 and slide bearing 57 are provided so that gas supply nozzle 11 can move parallel to a central axis of thereof while maintaining the interior of ion source chamber 15 hermetically sealed.

Use of the above mechanism can move ion outlet 13 in arc chamber 9 parallel to the traveling direction of ion beam 2, using rotation of ball screw E 50 caused by small servo motor 58 as force. A part of extracting electrode 14 has a structure that is generally employed in a conventional Freeman ion source.

Procedure for Controlling Beam Current Value

A description is provided of a procedure for controlling a beam current value, using a mechanism for varying a shape of ion outlet 13. Ion outlet 13 is shaped to have a small lateral width and a large longitudinal dimension, for example. For such a shape, it is known that changing the longitudinal dimension can change a beam current value, without decreasing an energy resolution of ion beam 2. In other words, the larger the longitudinal dimension, the larger the beam current value. The smaller the longitudinal dimension, the smaller the beam current value. By utilizing the above property, the beam current value can be controlled within a desired range. Specifically, a threshold value is provided in measurements of beam current taken with a beam current measuring device. Then, when a measurement exceeds the threshold value, the longitudinal dimension of ion outlet 13 is changed so that the beam current value is smaller than the threshold value. For example, when a measurement of beam current is smaller than the threshold value, controller 59, which will be described later, instructs drivers 40 to activate small servo motors 30. Then, partition plates 39 move so that the longitudinal dimension of ion outlet 13 is increased. Thereafter, when measurement of beam current reaches a desired value, small servo motors 30 are stopped. Thus, a beam current value is controlled within a predetermined range.

Next, a description is provided of a procedure for controlling a beam current value, using a mechanism for varying a position of arc chamber 9. This mechanism can move the position of arc chamber 9 toward and away from extracting electrode 14. When arc chamber 9 is nearer to extracting electrode 14, an extracting electric field increases. On the other hand, when arc chamber 9 is farther from extracting electrode 14, the extracting electric field decreases. This mechanism utilizes this phenomenon. However, because ion density in plasma at a given point is not known, it is also unknown in which direction arc chamber should be moved to increase or decrease a beam current value. Thus, the following method is employed. When a measurement of beam current exceeds a threshold value, controller 59 slightly moves arc chamber 9 in either direction. Then, depending on whether the measurement of beam current at that time has increased or decreased, controller 59 determines if this moving direction is right or not. If the measurement of beam current has changed to a value smaller than the threshold value, arc chamber 9 is moved in that direction. On the other hand, if the measurement of beam current has changed to a value larger than the threshold value, arc chamber 9 is moved in the opposite direction. Thereafter, when the measurement of beam current reaches a desired value, small servo motor 48 is stopped. In this manner, an appropriate extracting electric field can be set during ion implantation, according to the ion density in plasma that changes with time. Additionally, the above method can control a beam current value within a desired range. A procedure is the same for use of a mechanism for varying a position of the extracting electrode.

Structure of Ion-Implanting Apparatus

Figure 7:
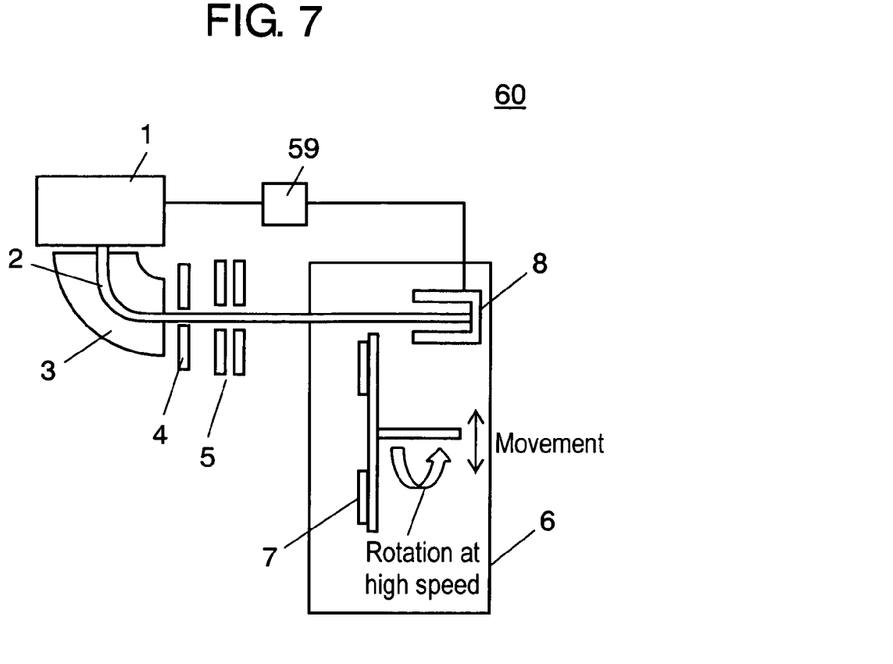
FIG. 7 is a sectional view of an essential part showing an example of an ion-implanting apparatus in accordance with the present invention.

FIG. 7 shows an example of ion-implanting apparatus 60 of the present invention. Ion-implanting apparatus 60 of the present invention has a beam current control function added to conventional ion-implanting apparatus 17. In ion-implanting apparatus 60 of the present invention, a measurement performed with Faraday cup 8 is transferred to controller 59. Then, controller 59 instructs a driver unit, such as a small servo motor placed in ion source 1, to operate. Feedback on the operation results of the driver unit is given from Faraday cup 8 to controller 59 as a change in measurement of beam current. Then, following the procedure described in [Procedure for controlling beam current value], a beam current value is controlled within a desired range.

Figure 8:
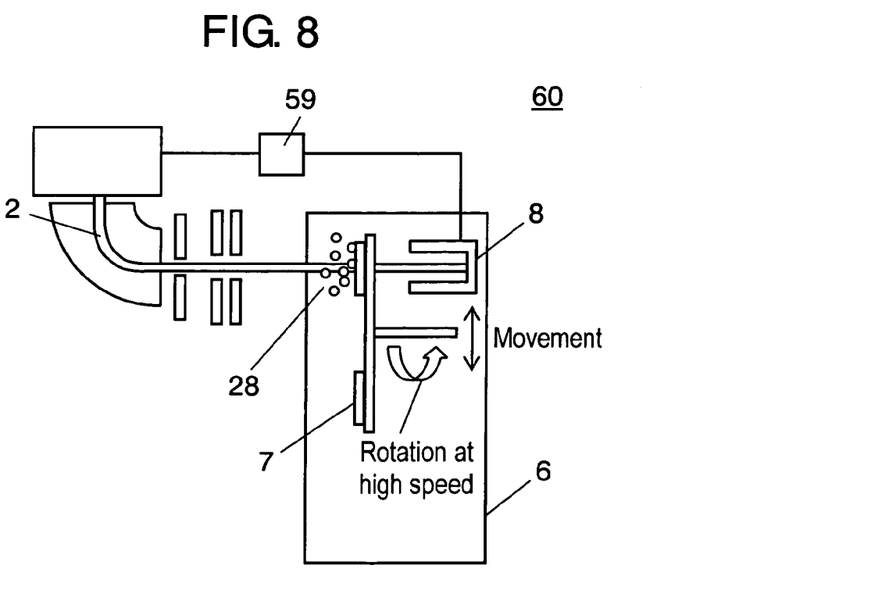
FIG. 8 is a sectional view of an essential part of an ion-implanting apparatus showing a structure thereof during ion implantation using the ion source of FIG. 6.
Figure 9:
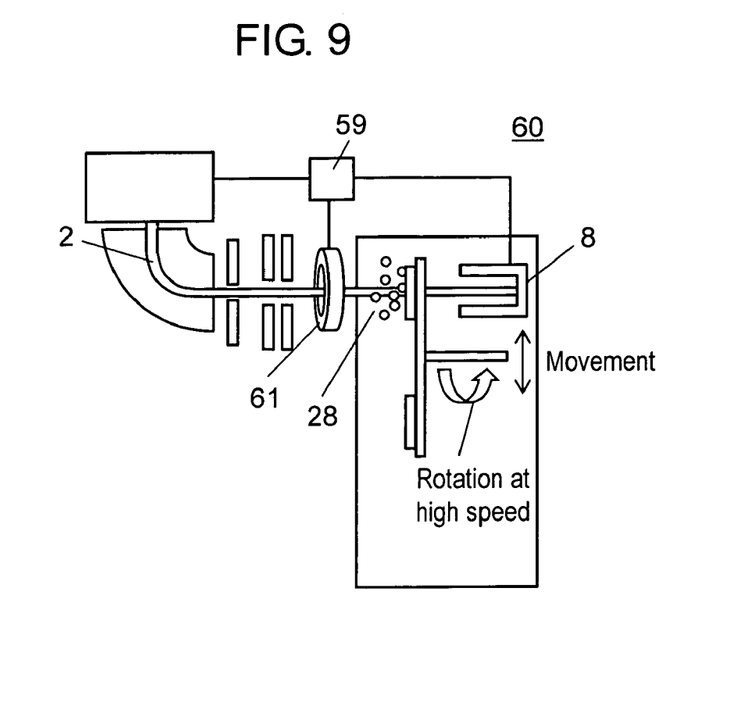
FIG. 9 is a sectional view of an essential part showing an example of an ion-implanting apparatus using a non-destructive beam current measuring device in accordance with the present invention.

Further, a description is provided with reference to FIG. 8. When semiconductor wafer 7 is irradiated with ion beam 2, outgas 28 is generated from a resist. When ion beam 2 passes through outgas 28, outgas 28 deprives the ion beam of electric charge. As a result, a measurement performed with Faraday cup 8 decreases by approximately 10% from an actual beam current value. Because a rate of decrease is proportional to a pressure inside implantation room 6, a method of correcting a measurement of beam current by measuring the pressure is known. In the present invention, during ion implantation, an objective is achieved by giving feedback on this correction to controller 59. Alternatively, it is also acceptable that feedback on the measurement performed with Faraday cup 8 taken when no outgas is emitted is given to controller 59, after semiconductor wafer 7 is moved to a position not in contact with ion beam 2, i.e. in a state as shown in FIG. 7. Further, as shown in FIG. 9, a beam current value can be measured with a non-destructive beam current measuring device 61 before ion beam 2 passes through outgas 28. Non-destructive beam current measuring device 61 can provide a method of taking measurement without affecting beam current. For example, a beam current measuring device or a DC converter is used. In the present invention, feedback on measurement taken with non-destructive beam current measuring device 61 to controller 59 can also achieve the objective.

This exemplary embodiment describes a method of controlling a beam current value dynamically varying with time so that the beam current value is kept constant. However, it is obvious that the beam current value can be controlled so that it varies arbitrarily instead of being constant. Additionally, in the same manner, beam current density of an ion beam can be controlled.

The present invention can provide an ion-implanting method and ion-implanting apparatus that can dynamically control a beam current value of an ion beam with time and does not change energy. In the same manner, beam current density of an ion beam can be controlled. Thus, by this ion-implanting apparatus or this ion-implanting method, various kinds of devices are manufactured.

What is claimed is:

1. An ion-implanting apparatus comprising:
   an ion source for generating an ion beam, said ion source having an arc chamber including an ion outlet;
   a beam current measuring device for measuring a current value of the ion beam, said beam current measuring device including a sensor sensitive to magnetic flux; and
   a control system for controlling the current value of the ion beam to be a constant or predetermined value by using the current value, as measured by said beam current measuring device, to control a shape of said ion outlet or a position of said arc chamber.

2. The ion-implanting apparatus according to claim 1, wherein
   said beam current measuring device includes
   (i) a detecting section for detecting or collecting a magnetic field corresponding to a current of the ion beam, and
   (ii) a measuring section including
      (a) a superconducting quantum interference device sensitive to magnetic flux, and
      (b) a feedback coil for carrying feedback current to cancel out a change in the magnetic flux penetrating through said superconducting quantum interference device.

3. The ion-implanting apparatus according to claim 2, wherein
   said beam current measuring device further includes a magnetic shielding section made of a superconductor for magnetically shielding said detecting section and said measuring section from an external space including a space for carrying the ion beam.

4. The ion-implanting apparatus according to claim 1, wherein
   said beam current measuring device is to be on an upstream side of the ion beam, and is for measuring the current of the ion beam while the ion beam is being irradiated on an object to be processed.

5. The ion-implanting apparatus according to claim 1, further comprising:
   a mechanism to be driven by at least one selected from the group consisting of a force resulting from deformation of a piezoelectric element, a force resulting from gas pressure, a force resulting from liquid pressure, a force resulting from thermal deformation, and a force generated by a motor, for varying the shape of said ion outlet.

6. The ion-implanting apparatus according to claim 5, wherein
   the motor is selected from the group consisting of a servo motor, a linear motor, a stepping motor, and an ultrasonic motor.

7. The ion-implanting apparatus according to claim 5, further comprising:
an ion source chamber; and
a lid for closing said ion source chamber,
wherein said mechanism for varying the shape of said ion outlet is attached to said lid, and
wherein said lid, said arc chamber, and said mechanism for varying the shape of said ion outlet define a structure that is attachable to said ion source chamber by attaching said lid to said ion source chamber, and is detachable from said ion source chamber by detaching said lid from said ion source chamber.

8. The ion-implanting apparatus according to claim 1, further comprising:
at least one mechanism selected from the group consisting of a slit, a shutter, a valve, a door, and a nozzle, for varying the shape of said ion outlet.

9. The ion-implanting apparatus according to claim 8, further comprising:
an ion source chamber; and
a lid for closing said ion source chamber,
wherein said at least one mechanism for varying the shape of said ion outlet is attached to said lid, and
wherein said lid, said arc chamber, and said at least one mechanism for varying the shape of said ion outlet define a structure that is attachable to said ion source chamber by attaching said lid to said ion source chamber, and is detachable from said ion source chamber by detaching said lid from said ion source chamber.

10. The ion-implanting apparatus according to claim 1, wherein
said ion outlet has a longitudinal dimension that is greater than a transverse dimension thereof, with the longitudinal dimension being variable.

11. An active device and a passive device, both manufactured by an ion-implanting apparatus comprising:
an ion source for generating an ion beam, said ion source having an arc chamber including an ion outlet;
a beam current measuring device for measuring a current value of the ion beam, said beam current measuring device including a sensor sensitive to magnetic flux; and
a control system for controlling a variation in the current value of the ion beam by using the current value, as measured by said beam current measuring device, to control a parameter selected from the group consisting of a shape of said ion outlet, a position of an extracting electrode, a dopant gas flow, a dopant gas pressure, a current and voltage applied to a filament, an arc voltage, an arc current, magnetic field strength for trapping an electron inside of said arc chamber, and a position of said arc chamber.

12. The active device and the passive device according to claim 11, wherein
the active device is one of a semiconductor, liquid crystal, and biochip, and
the passive device is one of a resistor, coil, and capacitor.

13. An ion-implanting method comprising:
using a beam current measuring device to measure a current value of an ion beam generated by an ion source having an arc chamber including an ion outlet, said beam current measuring device including a sensor sensitive to magnetic flux; and
controlling the current value of said ion beam to be a constant or predetermined value by using the current value, as measured by said beam current measuring device, to control a shape of said ion outlet or a position of said arc chamber.

14. The ion-implanting method according to claim 13, wherein
using a beam current measuring device to measure a current value of the ion beam comprises using, to measure the current value of the ion beam, a device including
(i) a detecting section for detecting or collecting a magnetic field corresponding to a current of the ion beam, and
(ii) a measuring section including
(a) a superconducting quantum interference device sensitive to magnetic flux, and
(b) a feedback coil for carrying feedback current to cancel out a change in the magnetic flux penetrating through said superconducting quantum interference device.

15. The ion-implanting method according to claim 14, wherein
using a beam current measuring device to measure a current value of the ion beam comprises using, to measure the current value of the ion beam, a device including a magnetic shielding section made of a superconductor for magnetically shielding said detecting section and said measuring section from an external space including a space carrying the ion beam.

16. The ion-implanting method according to claim 13, wherein
said beam current measuring device is on an upstream side of the ion beam, and is for measuring the current of the ion beam while the ion beam is being irradiated on an object to be processed.

17. The ion-implanting method according to claim 13, wherein
using the current value as measured by said beam current measuring device to control a shape of said ion outlet comprises using the current value as measured by said beam current measuring device to cause a mechanism to be driven by at least one selected from the group consisting of a force resulting from deformation of a piezoelectric element, a force resulting from gas pressure, a force resulting from liquid pressure, a force resulting from thermal deformation, and a force generated by a motor, and thereby vary the shape of said ion outlet.

18. The ion-implanting method according to claim 17, wherein
the motor is selected from the group consisting of a servo motor, a linear motor, a stepping motor, and an ultrasonic motor.

19. The ion-implanting method according to claim 17, wherein
said mechanism for varying the shape of said ion outlet is attached to a lid for closing an ion source chamber, and
said lid, said arc chamber, and said mechanism for varying the shape of said ion outlet define a structure that is attachable to the ion source chamber by attaching said lid to the ion source chamber, and is detachable from the ion source chamber by detaching said lid from the ion source chamber.

20. The ion-implanting method according to claim 13, wherein
using the current value as measured by said beam current measuring device to control a shape of said ion outlet comprises using the current value as measured by said beam current measuring device to cause a mechanism selected from the group consisting of a slit, a shutter, a valve, a door, and a nozzle to vary the shape of said ion outlet.

21. The ion-implanting method according to claim 20, wherein said mechanism for varying the shape of said ion outlet is attached to a lid for closing an ion source chamber, and said lid, said arc chamber, and said mechanism for varying the shape of said ion outlet define a structure that is attachable to the ion source chamber by attaching said lid to the ion source chamber, and is detachable from the ion source chamber by detaching said lid from the ion source chamber.

22. The ion-implanting method according to claim 13, wherein said ion outlet has a longitudinal dimension that is greater than a transverse dimension thereof, and using the current value as measured by said beam current measuring device to control a shape of said ion outlet comprises using the current value as measured by said beam current measuring device to vary said longitudinal dimension.

* * * * *